(12) United States Patent
Fujii et al.

(10) Patent No.: US 6,384,418 B1
(45) Date of Patent: May 7, 2002

(54) SAMPLE TRANSFER APPARATUS AND SAMPLE STAGE

(75) Inventors: Toshiaki Fujii; Yasuhiko Sugiyama, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/314,060

(22) Filed: May 18, 1999

(30) Foreign Application Priority Data

May 18, 1998 (JP) ............................................. 10-135639

(51) Int. Cl.[7] ........................ B21D 25/04; H01L 21/306
(52) U.S. Cl. ............................... 250/440.11; 250/441.11
(58) Field of Search ........................ 250/440.11, 442.11, 250/441.11

(56) References Cited

U.S. PATENT DOCUMENTS

| | | | | |
|---|---|---|---|---|
| 5,164,218 A | * | 11/1992 | Tsuruta | ........................... 437/6 |
| 5,478,782 A | * | 12/1995 | Satoh | .......................... 437/250 |
| 5,672,816 A | * | 9/1997 | Park | ............................. 73/105 |
| 6,054,371 A | * | 4/2000 | Tsuchiaki | ................... 438/458 |
| 6,077,027 A | * | 6/2000 | Kawamura | ............... 414/744.5 |

* cited by examiner

*Primary Examiner*—Jack Berman
*Assistant Examiner*—Anthony Quash
(74) *Attorney, Agent, or Firm*—Adams & Wilks

(57) ABSTRACT

A sample transfer apparatus has a transfer arm for supporting a sample and is mounted for undergoing movement to transfer the sample from a first station to a second station. The transfer arm has a holding portion for holding the sample by hydrogen bonding.

19 Claims, 4 Drawing Sheets

SAMPLE TRANSFER APPARATUS AND SAMPLE STAGE

BACKGROUND OF THE INVENTION

The present invention relates to an apparatus for transferring or moving a plate-like sample, and more particularly to a sample transfer apparatus which loads and unloads the sample into and from a reaction chamber and a sample stage which is installed in the reaction chamber and is moved in the reaction chamber while holding the sample in a semiconductor relevant apparatus (such as an electron beam drafting apparatus, an electron microscope, a focused ion beam processing apparatus or the like) for treating the sample such as a semiconductor wafer, a glass substrate or the like.

A typical example of the sample transfer apparatus is explained in view of FIG. 1.

In a semiconductor manufacturing apparatus, the sample transfer apparatus used for transferring a semiconductor wafer, a glass substrate or the like determines a position where the sample is to be transferred in a three dimensional manner as shown in FIG. 1B. Namely, the height Z of the position where the sample is to be transferred is determined by a first drive shaft. Furthermore, using the center of the first rotary shaft of the sample transfer apparatus as the origin, the position where the sample is to be moved, a rotational angle $\Theta$ and a transfer distance R, and a direction $\theta$ of the sample are determined by first, second and third rotating angles $\theta1$, $\theta2$, $\theta3$.

Here, a sample holding portion is requested to hold the sample without falling the sample during the transfer of the sample. To this end, as shown in FIG. 2, the sample holding portion is provided with a recess having a shape suitable for accommodating the sample and hence, even if the sample holding portion is slightly tilted, the sample is prevented from falling. Furthermore, the sample holding portion may be provided with a vacuum adhesion mechanism for fixedly mounting the sample to the sample holding portion.

Subsequently, an example of a typical two-axis sample stage is explained in view of FIG. 3.

In a semiconductor relevant apparatus, the two-axis sample stage used for holding the semiconductor wafer, the glass substrate or the like in the reaction chamber includes a first drive shaft and a second drive shaft which determine the position where the sample is to be transferred in a two dimensional manner. The sample is mounted on and held by a sample holding portion. The first drive shaft and the second drive shaft are respectively equipped with a first drive motor and a second drive motor and the sample is moved in X, Y directions by driving them respectively.

Here, the sample holding portion is requested to hold the sample without falling the sample as in the case of the sample transfer system and without moving the sample within the sample holding portion. Accordingly, as shown in FIG. 3, for example, the sample holding portion is provided with a recess having a shape suitable for accommodating the sample therein and hence, even if the sample holding portion is tilted, the sample is prevented from falling and shifting. Furthermore, as shown in FIG. 4, a method which uses a mechanism to clamp the sample mechanically or an static electricity chuck which adheres the sample using a static electric force for fixedly mounting the sample to the sample holding portion has been adopted.

Both the sample transfer apparatus and the sample stage which are used in a semiconductor relevant apparatus which processes the plate-like sample such as the semiconductor wafer or the glass substrate are provided with provisions for preventing the sample from falling.

However, in such a sample transfer apparatus, in case of the first method where the sample holding portion is provided with the recess having a shape suitable for accommodating the sample, it is necessary that the worked shape of the recess is produced with a high precision for firmly holding the sample. Accordingly, there exists the least margin or play between the shape of the sample and the shape of the recess and hence, depending on the position where the sample is placed, the sample is not accommodated in the recess and, as a result, the sample is transferred in an oblique condition and it gives rise to a problem that the sample falls. Furthermore, it is necessary to change the shape of the recess corresponding to the shape of the sample and its application method has been restricted. Furthermore, in case there is no affinity between the sample and the sample holding portion, a repulsive force works between them so that the sample cannot be accommodated in the recess.

Furthermore, in case of the second method which adopts the vacuum adhesion mechanism, it is an extremely effective method so long as it is used in the atmosphere. However, in the semiconductor manufacturing apparatus, it is often that the reaction chamber is under vacuum. In such a case, there exists no pressure difference between the sample holding side and its opposite side and hence, no sample holding force is generated and the method is totally inoperative.

Furthermore, with respect to the sample stage, in case of a mechanism which includes a presser foot for mechanically pressing the sample of the above-mentioned first method, since the sample cannot be pressed from its front surface, the sample must be pressed utilizing a force which is directed from the periphery to the center and hence, there arises a problem that the sample is deflected in an upwardly convex shape from the periphery to the center.

Still furthermore, in case of the static electricity chuck of the second method mentioned above, the sample 1 is adhered using the static electricity and hence, by finishing the surface of the sample flat, the sample is free from the deflection thereof which occurs in the above-mentioned first method. However, the method has several problems such that the static electricity chuck is made of ceramic and accordingly expensive, and has a complicated construction since a high voltage power source of some hundreds volts is necessary to generate the static electricity, and requires a careful designing for assuring the safety to avoid an electric shock accident since it uses the high voltage power source.

SUMMARY OF THE INVENTION

The present invention adopts a hydrogen bonding to overcome the above-mentioned problems.

Recently the research of the technology on the wafer lamination has been underway and it has been found that due to the hydrogen bonging which is attributed to the silicon oxide on the surface of the wafer, the wafers are laminated with each other. For instance, such a fact is introduced in "SOI device view" (Applied Physics Vol.66, No. 11, 1997). In general, the hydrogen bonding is attributed to the nature of hydrogen present on the surface of the sample and it is known that the surface of a material to which the hydrogen bonding is applicable has hydrophilic property which prevents a repelling of water when it comes into contact with water. It is also known that in addition to the silicon oxide, silicon nitride can make use of the nature of the hydrogen bonding in the same manner.

The present invention makes use of the adhesion of sample using this hydrogen bonding and realizes a highly reliable holding of the sample.

DETAILED DESCRIPTION OF THE INVENTION

Figure 1A:
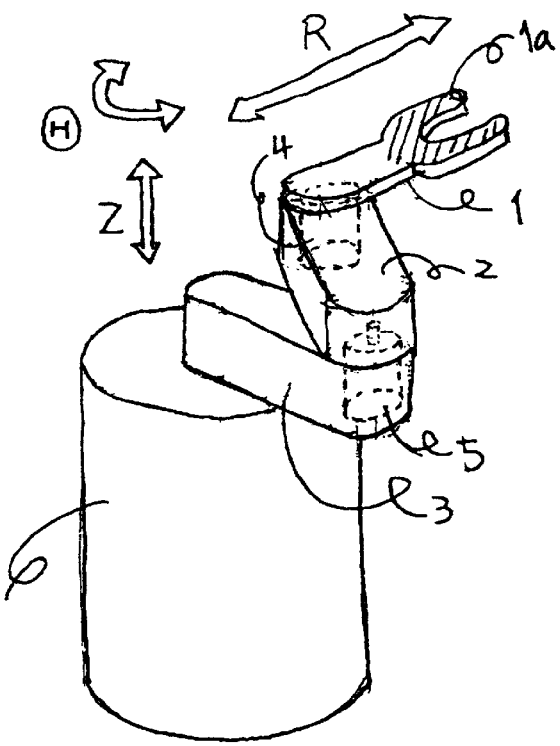
FIG. 1A is a perspective view of one embodiment of the present invention.
Figure 1B:
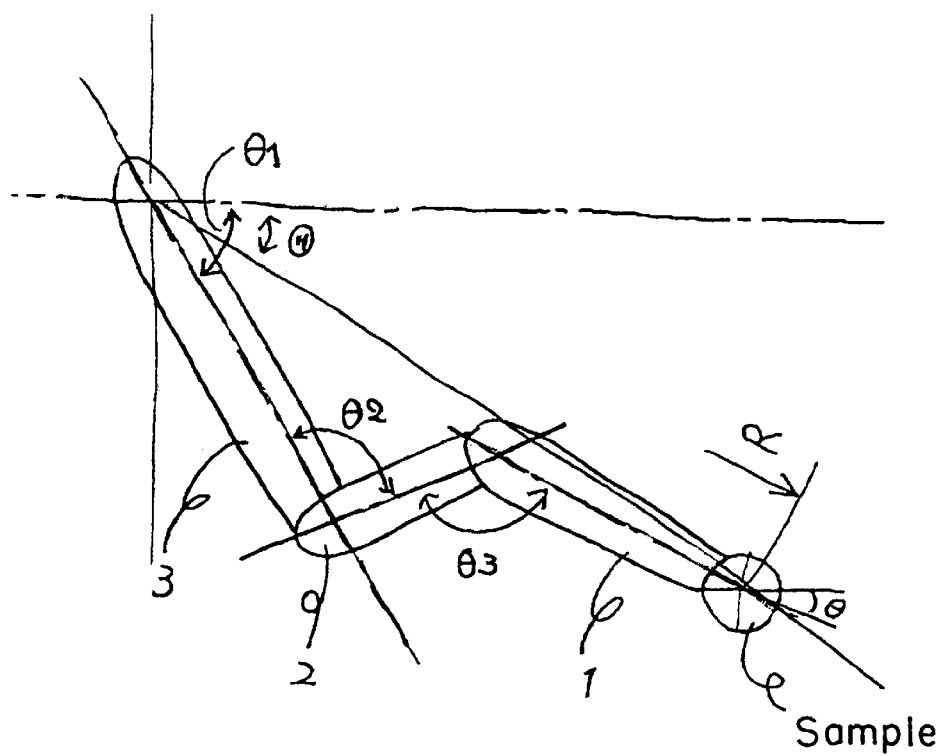
FIG. 1B is an explanatory view on a two-dimensional positioning of a sample using an apparatus of the embodiment.

The embodiment of the present invention is explained in conjunction with FIG. 1.

In a semiconductor manufacturing apparatus, FIG. 1A shows a perspective view of a sample transfer apparatus used for transferring a semiconductor wafer, a glass plate or the like to the semiconductor manufacturing apparatus. A mounting plate 1 for mounting a sample not shown in drawings is provided with a contact portion 1a shown in a hatch and the sample is directly mounted on and comes into contact with the contact portion 1a. The surface of the contact portion 1a is provided with a mirror finish and is coated with silicon oxide. The sample not shown in drawings is generally a semiconductor wafer or a glass substrate. In case of the semiconductor wafer, the wafer is generally covered with silicon oxide or silicon nitride which is grown during its manufacturing process. Furthermore, even when they are removed by etching, so long as they are preserved in an atmosphere, a natural oxide film is usually formed on its surface. Furthermore, the glass substrate per se may be silicon oxide or is a material having a high hydrophilic property. Namely, a hydrophilic material which contributes to the hydrogen boding is present on the rear surface of the sample. The rear surface of the sample (the surface which the contact portion 1a comes into contact with) is provided with a flat mirror finish or a similar level of finish. When the sample is mounted on the mounting plate 1 in such a manner that the rear surface of the sample comes into contact with the contact portion 1a, the sample is adhered to the mounting plate 1 due to the hydrogen bonding. Here, both have the mirror-finished surface or the flatness close to the mirror-finished surface so that their bonding areas which adhere to each other are widened thus providing a stable adhesion.

Furthermore, the mounting plate 1 is rotatably mounted on a first arm plate 2 by means of a motor 4 installed in the first arm plate 2. Furthermore, the first arm plate 2 is rotatably mounted on a second arm plate 3 by means of a motor 5 installed in the second arm plate 3. Still furthermore, the second arm plate 3 is mounted on an actuator 6 in such a manner that it is rotatable and is movable in an axial direction (Z direction).

Factors which determine the position where the sample is to be moved in a three dimensional manner are a first rotating angle $\theta1$, a second rotating angle $\theta2$, a third rotating angle $\theta3$, and a height Z. A distance R from the axis of the first rotating angle $\theta1$ to the mounting plate 1, a direction $\Theta$, and a direction $\theta$ of the sample are univocally determined by controlling the first to third rotating angles and the sample is transferred to a given position. The first rotating angle $\theta1$, the second rotating angle $\theta2$, the third rotating angle $\theta3$, and the height Z are controlled by a CPU not shown in drawings.

The manner of operation is explained hereinafter. The sample is mounted on a first shelf not shown in drawings. The sample mounted on the first shelf is lifted by the mounting plate 1 of the sample transfer apparatus of the present invention. Here, before lifting the sample, dusts adhered to the rear surface of the sample and to the contact portion 1a which constitutes a sample holding portion are removed by a method which adopts a blow of air of high cleanliness or a static electricity. Accordingly, the degree of close contact or adhesion between the rear surface of the sample and the contact portion 1a is enhanced and hence, the adhering force is increased and the reliability of sample transfer is enhanced. Thereafter, the sample is moved to a second shelf which constitutes a part of the semiconductor manufacturing apparatus and a place to which the sample is to be transferred.

Both the first and second shelves are provided with notches so as to prevent the contact portion 1a of the sample transfer apparatus of the present invention from coming into contact with the shelves. When the contact portion 1a enters either notch, the sample comes into contact with either the first shelf or the second shelf and is removed from the contact portion 1a. Since the adhering force between the rear surface of the sample and the surface of the sample holding portion of the sample transfer apparatus is not strong enough to cause a rupture of the sample, the sample is mounted on the second shelf.

Furthermore, here, the first and second shelves may be constituted by a sample holding portion of a cassette holder or a sample stage. Furthermore, a surface thereof which comes into contact with the surface of the sample may be provided with a mirror finish and is coated with a hydrophilic material.

Figure 2:
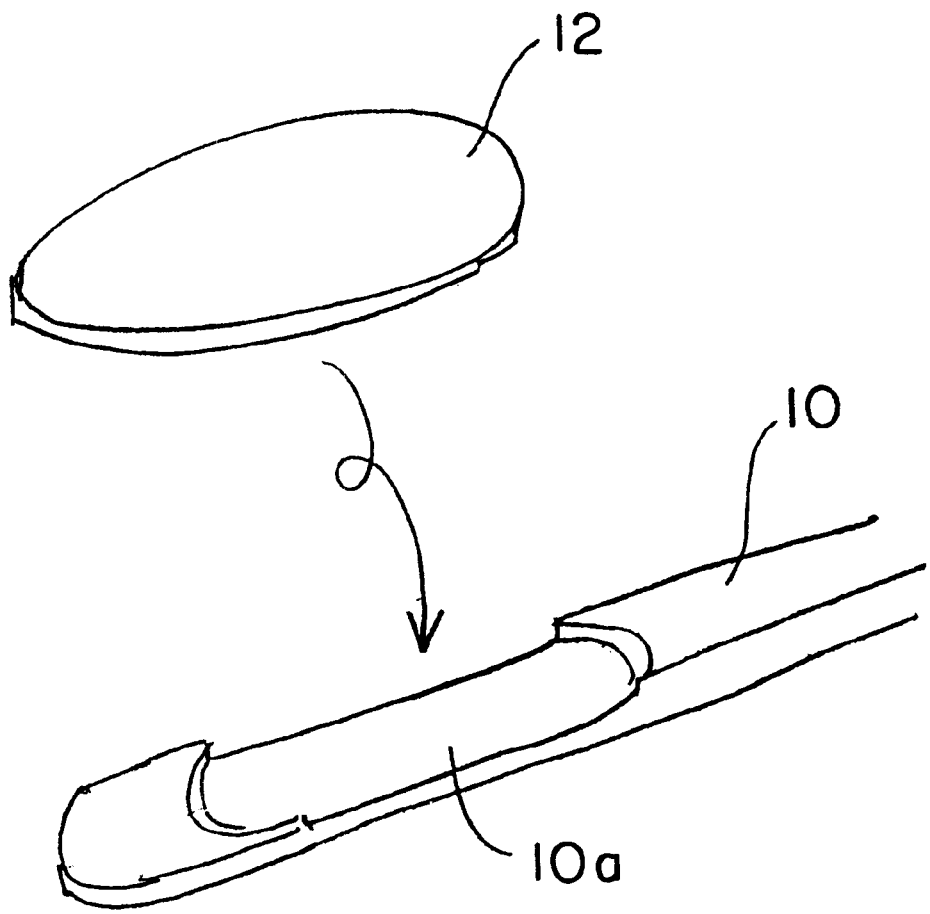
FIG. 2 is a perspective view of a sample holding portion of a conventional sample transfer apparatus.

Still furthermore, the sample holding portion of the sample transfer apparatus may be provided with a recess as shown in FIG. 2. In this case, the high working accuracy pointed out with respect to the prior art is not required. By restricting the shift of the sample with the recess, the reliability of the transfer of the sample is further enhanced.

Figure 3:
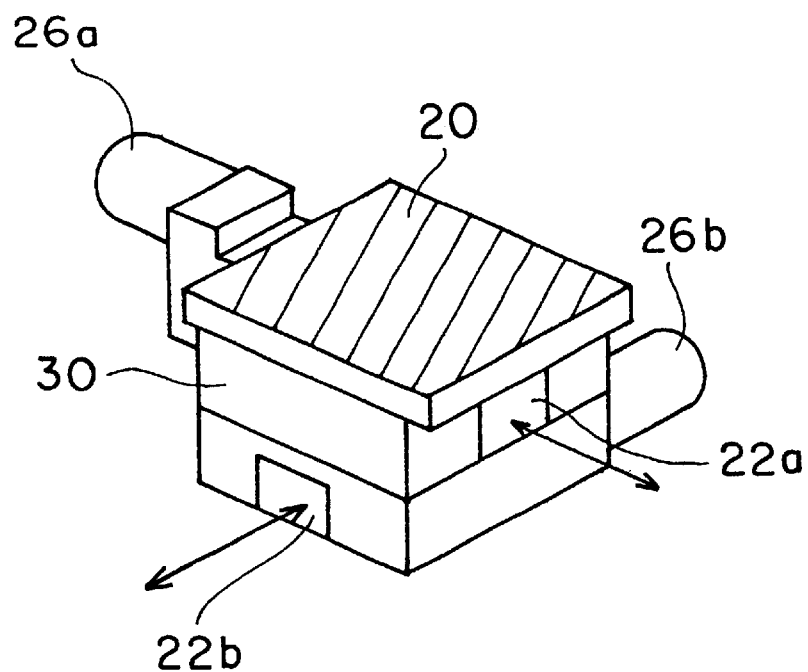
FIG. 3 is a perspective view of a two-axis sample stage of the present invention.

Subsequently, the second embodiment of the present invention is explained using an example of a typical two-axis sample stage shown in FIG. 3.

In a semiconductor relevant apparatus, a two-axis sample stage used for holding and moving a sample such as a semiconductor wafer or a glass substrate in a reaction chamber is composed of a first drive shaft and a second drive shaft which determine a position where the sample is to be moved in a two dimensional manner. The sample is mounted on and held by a sample holding portion. Here, a portion of the sample holding portion which comes into contact with the sample is provided with a flat mirror finish and the surface is coated with silicon oxide. The first drive shaft and the second drive shaft are respectively provided with a first drive motor and a second drive motor and the sample is moved in X, Y directions by driving them respectively.

The sample which may be a semiconductor wafer, a glass plate or the like has its rear surface provided with a mirror finish or a surface condition similar to the mirror finish and generally a hydrophilic material such as silicon oxide or silicon nitride which contributes to a hydrogen bonding is present on the surface. Accordingly, the surface of the sample holding portion and the surface of the sample are adhered to each other by the hydrogen bonding. Here, as shown in FIG. 3, the sample holding portion may be provided with a recess having a shape suitable for accommodating the sample for making the position of the sample relative to the sample holding portion always fixed.

It may be possible to fixedly mount a retainer plate having a thickness smaller than the depth of the recess in the recess of the sample holding portion although not shown in drawings. The retainer plate is made of a material which contributes to the hydrogen bonding and has a mirror-finished surface. The material of the retainer plate may preferably be a material having a hydrophilic property such as silicon oxide or silicon nitride. Although the working to make the bottom of the recess like a flat mirror-finished surface is difficult, the provision of the retainer plate facilitates such a mirror-finish working.

The sample is brought into contact with the retainer plate and is held in the recess by the hydrogen bonding.

Figure 4:
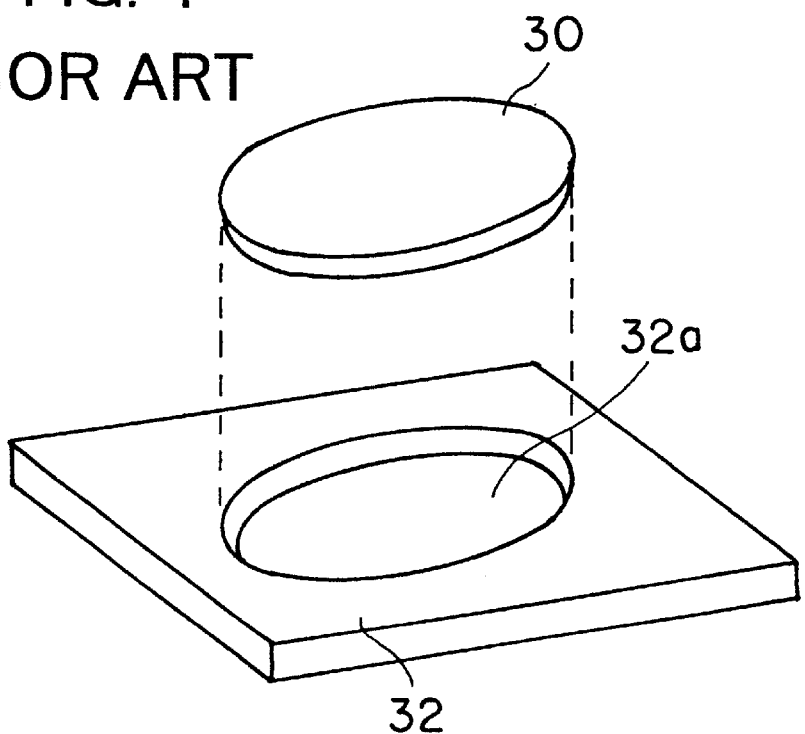
FIG. 4 is a schematic view of a recess provided to the sample holding portion of the conventional sample stage.

Furthermore, as shown in FIG. 4, a weight or a presser foot may be used together. Due to such a use, the sample can be held with a higher reliability. In case of using the weight, however, it is necessary to press the sample with a weak force which does not deflect the sample.

The third embodiment of the present invention is explained hereinafter.

Figure 5:
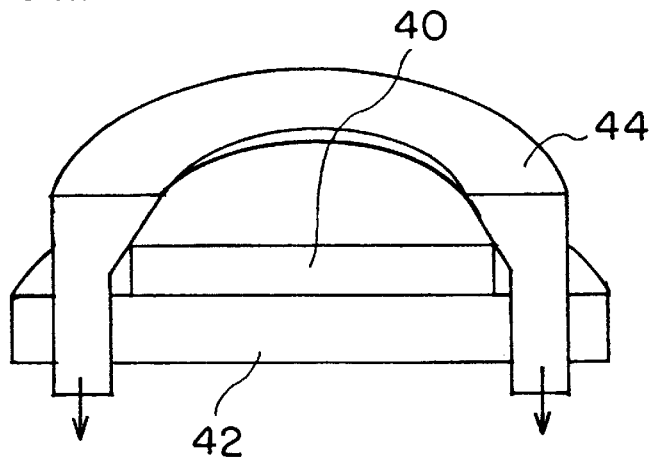
FIG. 5 is an explanatory view showing a presser foot used for the sample holding portion of the conventional sample stage.
Figure 6:
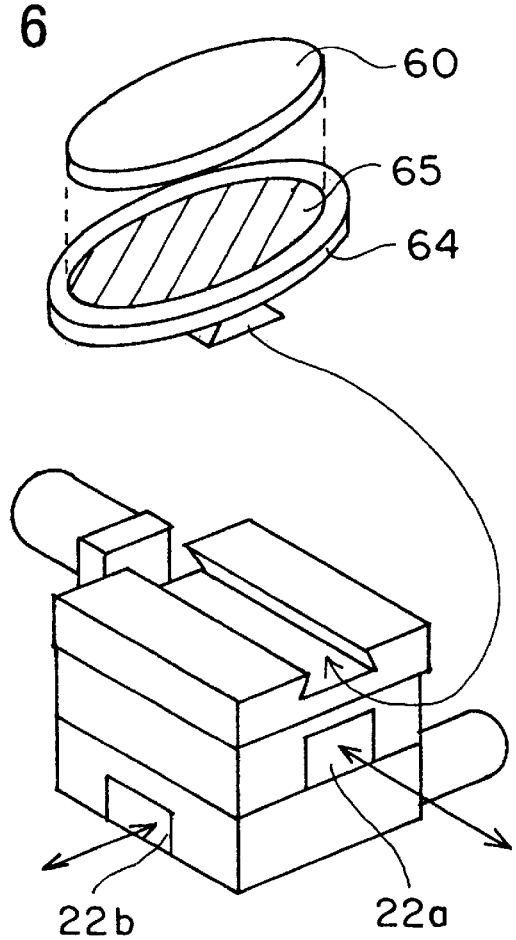
FIG. 6 is a perspective view of the sample stage using a sample holder.

As shown in FIG. 5, an electron microscope or a focused ion beam apparatus which constitutes a semiconductor relevant apparatus may be provided with an exclusive sample holding portion for holding a sample such as a semiconductor wafer or a glass substrate and the exclusive sample holding portion is replaceably mounted on a sample stage as a sample holder. In this case, a part of the sample holding portion of the sample holder which comes into contact with the sample is provided with a flat mirror finish and is coated with a hydrophilic material. Due to such a construction, the sample and the sample holder are adhered to each other by a hydrogen bonding.

Although a two-axis sample stage having a simple construction is used in the explanation of the sample stage for a brevity purpose, the same effect or advantage is obtained even in a case one axis such as a rotation is used or drive shafts for elevation, rotation, tilting and the like are added.

According to the present invention, making use of the hydrogen bonding which occurs between the sample and the sample holding portion, the reliability of sample holding is enhanced without using any special devices.

What is claimed is:

1. A sample transfer apparatus for transferring a sample from a first station to a second station, the sample transfer apparatus comprising: a transfer arm for supporting a sample and mounted for undergoing movement to transfer the sample from a first station to a second station, the transfer arm having a holding portion for holding the sample by hydrogen bonding.

2. A sample transfer apparatus according to claim 1; wherein the hydrophilic material is silicon oxide.

3. A sample transfer apparatus according to claim 1; wherein the holding portion of the transfer arm has a surface for supporting the sample; and wherein the surface of the holding portion has a flat mirror finish.

4. A sample transfer apparatus according to claim 1; further comprising a purifying mechanism for removing dust adhered to a surface of the sample which comes into contact with the sample holding portion of the transfer arm before the sample is supported by the transfer arm.

5. A sample transfer apparatus according to claim 1; wherein the holding portion of the transfer arm has a surface for supporting the sample; and wherein the surface of the holding portion is made of a hydrophilic material.

6. A sample transfer apparatus according to claim 5; wherein the hydrophilic material is silicon nitride.

7. A sample stage for supporting a sample thereon and for moving the sample, the sample stage comprising: a holding member for supporting a sample and mounted for undergoing movement to move the sample, the holding member having a recess having a surface for supporting the sample by hydrogen bonding.

8. A sample stage according to claim 7; wherein the surface of the recess of the holding member has a flat mirror finish.

9. A sample stage according to claim 7; further comprising a frame assembly; and wherein the holding member is removably mounted on the frame assembly.

10. A sample stage according to claim 7; wherein the surface of the recess of the holding member is made of a hydrophilic material.

11. A sample stage according to claim 10; wherein the hydrophilic material is silicon oxide.

12. A sample stage according to claim 10; wherein the hydrophilic material is silicon nitride.

13. A sample transfer apparatus comprising: at least one transfer arm for transferring a sample from a first station to a second station, the transfer arm having means for holding the sample by hydrogen bonding; and means for moving the transfer arm to transfer the sample to and from the first and second stations.

14. A sample transfer apparatus according to claim 13; wherein the holding means comprises a holding portion of the transfer arm having a recess for receiving the sample, and a film of silicon oxide disposed on a surface of the recess for contacting a surface of the sample.

15. A sample transfer apparatus according to claim 13; wherein the holding means comprises a holding portion of the transfer arm having a surface for contacting a surface of the sample, the surface being made of a hydrophilic material.

16. A sample transfer apparatus according to claim 15; wherein the hydrophilic material is silicon oxide.

17. A sample transfer apparatus according to claim 15; wherein the hydrophilic material is silicon nitride.

18. A sample transfer apparatus according to claim 13; wherein the holding means comprises a holding portion of the transfer arm having a surface for contacting a surface of the sample, and a film of silicon oxide disposed on the surface of the holding portion.

19. A sample transfer apparatus according to claim 18; wherein the surface of the holding portion has a flat mirror finish.

* * * * *